United States Patent
Wang et al.

(10) Patent No.: US 11,493,543 B1
(45) Date of Patent: Nov. 8, 2022

(54) VOLTAGE COMPARATOR AND OPERATION METHOD THEREOF

(71) Applicant: VIA LABS, INC., New Taipei (TW)

(72) Inventors: Wei-Yu Wang, New Taipei (TW); Yu-Chung Wei, New Taipei (TW)

(73) Assignee: VIA LABS, INC., New Taipei (TW)

( * ) Notice: Subject to any disclaimer, the term of this patent is extended or adjusted under 35 U.S.C. 154(b) by 0 days.

(21) Appl. No.: 17/535,579

(22) Filed: Nov. 25, 2021

(30) Foreign Application Priority Data

Sep. 16, 2021 (TW) .................................. 110134579

(51) Int. Cl.
*G01R 19/165* (2006.01)
*G01R 19/00* (2006.01)
*H03K 5/22* (2006.01)

(52) U.S. Cl.
CPC ... *G01R 19/16519* (2013.01); *G01R 19/0023* (2013.01); *G01R 19/16566* (2013.01); *H03K 5/22* (2013.01)

(58) Field of Classification Search
CPC ............ H03K 5/08; H03K 5/082; H03K 5/22; H03K 5/24; H03K 5/2472; H03K 5/2481; G01R 19/165; G01R 19/16504; G01R 19/16519; G01R 19/16566; G01R 19/16571; G01R 19/16576
See application file for complete search history.

(56) References Cited

U.S. PATENT DOCUMENTS

| 8,786,317 B2 * | 7/2014 | Terada ............. G01R 19/16566 327/78 |
| 9,857,816 B2 | 1/2018 | Bhattad |
| 11,262,775 B2 * | 3/2022 | Hermann .................. G05F 3/30 |
| 2019/0273473 A1 | 9/2019 | Gorbachov et al. |
| 2020/0204184 A1 | 6/2020 | Rattan |

FOREIGN PATENT DOCUMENTS

TW          I340307          4/2011

* cited by examiner

*Primary Examiner* — Long Nguyen
(74) *Attorney, Agent, or Firm* — JCIPRNET (57) ABSTRACT

A voltage comparator and an operation method thereof are provided. The voltage comparator includes an amplifying circuit, a reference current source, and a transient current source. A first input terminal and a second input terminal of the amplifying circuit respectively receive a first corresponding voltage corresponding to a target voltage and a reference voltage. The reference current source is coupled to the amplifying circuit to provide a reference current. The transient current source is coupled to the amplifying circuit to selectively provide a transient current. The transient current source detects a transition of a second corresponding voltage corresponding to the target voltage to dynamically adjust the transient current. Therefore, when a rapidly increasing voltage occurs in the target voltage, the transient current source may temporarily increase the current of the amplifying circuit, thereby accelerating the response speed of the amplifying circuit.

25 Claims, 8 Drawing Sheets

One of a first comparison terminal and a second comparison terminal receives a first corresponding voltage corresponding to a target voltage, the other one of the first comparison terminal and the second comparison terminal receives a reference voltage, and a detection terminal receives a second corresponding voltage corresponding to the target voltage — S510

A reference current source provides a reference current to an amplifying circuit, a transient current source detects a transition of the second corresponding voltage to dynamically adjust a transient current, and the transient current source selectively provides the transient current to the amplifying circuit — S520

VOLTAGE COMPARATOR AND OPERATION METHOD THEREOF

CROSS-REFERENCE TO RELATED APPLICATION

This application claims the priority benefit of Taiwan application serial no. 110134579, filed on Sep. 16, 2021. The entirety of the above-mentioned patent application is hereby incorporated by reference herein and made a part of this specification.

BACKGROUND

Technical Field

The disclosure relates to an electronic circuit, and particularly relates to a voltage comparator and an operation method thereof.

Description of Related Art

Voltage comparators are often applied to electronic circuits. The voltage comparator may compare two voltages (for example, a target voltage and a reference voltage). The current (for example, a reference current of an input pair) of the voltage comparator may affect the response speed of the voltage comparator. Generally speaking, the greater the reference current of the input pair of the voltage comparator, the faster the response speed of the voltage comparator. The reference current of the input pair of the conventional voltage comparator is fixed (or irrelevant to the transition of the target voltage). In other words, regardless of whether the target voltage is in a steady state or transitioning, the response speed of the conventional voltage comparator is fixed. In order to meet the requirements of product power consumption, the current of the voltage comparator is set to as small as possible, which means that the response speed of the voltage comparator is limited.

SUMMARY

The disclosure provides a voltage comparator and an operation method thereof to attend to requirements such as "small current" and "fast response".

In an embodiment of the disclosure, the voltage comparator includes a first comparison terminal, a second comparison terminal, a detection terminal, an amplifying circuit, a reference current source, and a first transient current source. One of the first comparison terminal and the second comparison terminal is adapted to receive a first corresponding voltage corresponding to a target voltage. Other one of the first comparison terminal and the second comparison terminal is adapted to receive a first reference voltage. The detection terminal is adapted to receive a second corresponding voltage corresponding to the target voltage. A first input terminal and a second input terminal of the amplifying circuit are respectively coupled to the first comparison terminal and the second comparison terminal. An output terminal of the amplifying circuit is coupled to an output terminal of the voltage comparator. The reference current source is coupled to the amplifying circuit to provide a reference current. The first transient current source is coupled to the amplifying circuit to selectively provide a first transient current. An input terminal of the first transient current source is coupled to the detection terminal of the voltage comparator to receive the second corresponding voltage, and the first transient current source detects a first transition of the second corresponding voltage to dynamically adjust the first transient current.

In an embodiment of the disclosure, the operation method includes the following steps. A first corresponding voltage corresponding to a target voltage is received by one of a first comparison terminal of a voltage comparator and a second comparison terminal of the voltage comparator. A first reference voltage is received by other one of the first comparison terminal and the second comparison terminal. A first input terminal and a second input terminal of an amplifying circuit of the voltage comparator are respectively coupled to the first comparison terminal and the second comparison terminal, and an output terminal of the amplifying circuit is coupled to an output terminal of the voltage comparator. A second corresponding voltage corresponding to the target voltage is received by a detection terminal of the voltage comparator. An input terminal of a first transient current source of the voltage comparator is coupled to the detection terminal to receive the second corresponding voltage. A reference current is provided to the amplifying circuit by a reference current source. A first transition of the second corresponding voltage is detected by the first transient current source to dynamically adjust a first transient current. The first transient current is selectively provided to the amplifying circuit by the first transient current source.

Based on the above, the reference current source in the embodiments of the disclosure may provide the reference current suitable for the target voltage in a steady state to the amplifying circuit. During the period when the target voltage is in the steady state, the first transient current source may reduce the absolute value of the first transient current as much as possible (even set the first transient current to 0 amperes) to meet the requirements of product power consumption. When a rapidly increasing voltage occurs in the target voltage, the first transient current source may temporarily increase the absolute value of the first transient current to increase the current of the amplifying circuit, thereby accelerating the response speed of the amplifying circuit during the transition period of the target voltage. Therefore, the voltage comparator can attend to requirements such as "small current" and "fast response".

In order for the features and advantages of the disclosure to be more comprehensible, the following specific embodiments are described in detail in conjunction with the accompanying drawings.

DETAILED DESCRIPTION OF DISCLOSED EMBODIMENTS

The term "coupling (or connection)" used in the entire specification (including the claims) of the present application may refer to any direct or indirect connection means. For example, if a first device is described as being coupled (or connected) to a second device, it should be interpreted as that the first device may be directly connected to the second device or the first device may be indirectly connected to the second device through other devices or certain connection means. Terms such as "first" and "second" mentioned in the entire specification (including the claims) of the present application are used to name elements or to distinguish different embodiments or ranges, and are not used to limit the upper limit or the lower limit of the number of elements and are also not used to limit the sequence of elements. In addition, wherever possible, elements/components/steps with the same reference numerals in the drawings and embodiments represent the same or similar parts. For elements/components/steps that use the same reference numerals or use the same terms in different embodiments, reference may be made to one another for related description.

Figure 1:
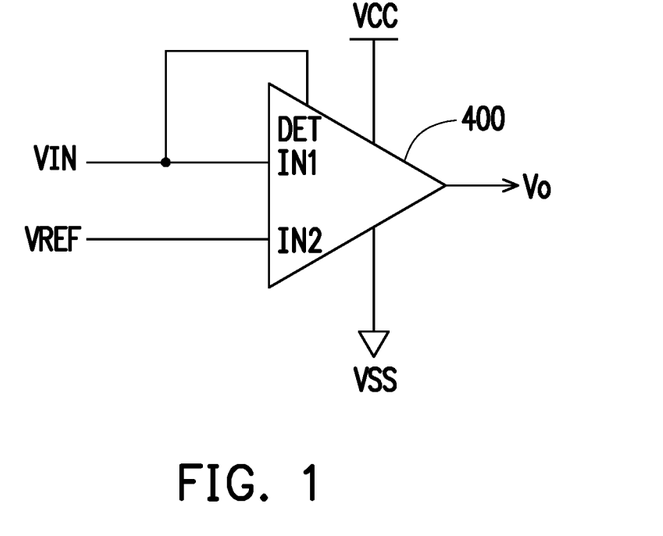
FIG. 1 is a schematic diagram of an application circuit of a voltage comparator according to an embodiment of the disclosure.

FIG. 1 is a schematic diagram of an application circuit of a voltage comparator 400 according to an embodiment of the disclosure. A power terminal and a reference voltage terminal of the voltage comparator 400 shown in FIG. 1 respectively receive a system voltage VCC and a reference voltage VSS (for example, a ground voltage or other fixed voltages). An output terminal of the voltage comparator 400 outputs an amplified voltage Vo. The voltage comparator 400 also includes a comparison terminal IN1, a comparison terminal IN2, and a detection terminal DET. According to actual design, in some embodiments, the comparison terminal IN1 may be a non-inverting input terminal, and the comparison terminal IN2 may be an inverting input terminal. In other embodiments, the comparison terminal IN1 may be an inverting input terminal, and the comparison terminal IN2 may be a non-inverting input terminal.

In the application example shown in FIG. 1, the comparison terminal IN1 of the voltage comparator 400 may receive a target voltage VIN as a first corresponding voltage. The comparison terminal IN2 of the voltage comparator 400 may receive a reference voltage VREF. The level of the reference voltage VREF may be determined according to actual design. The detection terminal DET of the voltage comparator 400 may receive the target voltage VIN as a second corresponding voltage. That is, in the application example shown in FIG. 1, the first corresponding voltage of the comparison terminal IN1 and the second corresponding voltage of the comparison terminal IN2 are both the same as the target voltage VIN.

Figure 2:
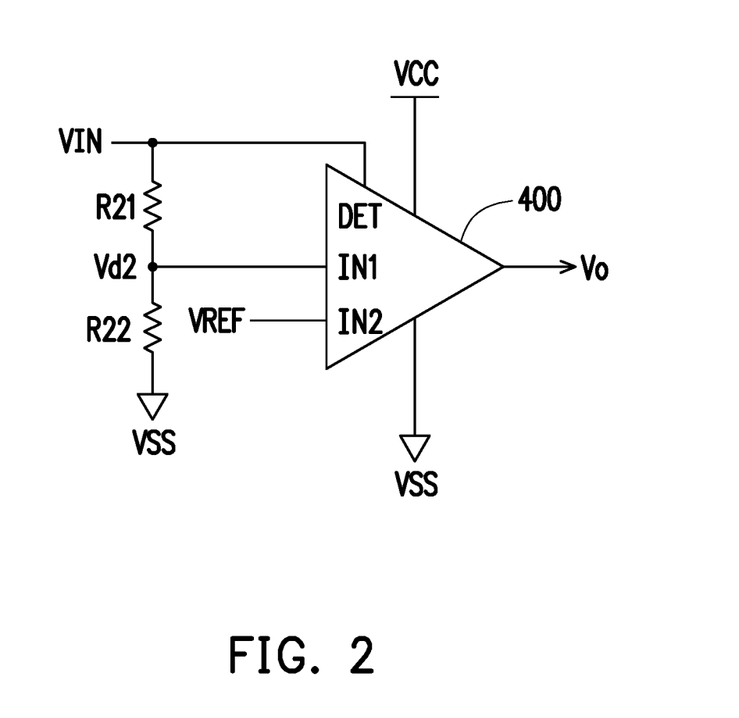
FIG. 2 is a schematic diagram of an application circuit of the voltage comparator according to another embodiment of the disclosure.

FIG. 2 is a schematic diagram of an application circuit of the voltage comparator 400 according to another embodiment of the disclosure. For the voltage comparator 400 shown in FIG. 2, reference may be made to the related description of the voltage comparator 400 shown in FIG. 1, so there will be no reiteration. In the application example shown in FIG. 2, the detection terminal DET of the voltage comparator 400 may receive the target voltage VIN as the second corresponding voltage. A first terminal of a resistor R21 receives the target voltage VIN. A first terminal of a resistor R22 is coupled to a second terminal of the resistor R21 to receive a divided voltage Vd2 (the first corresponding voltage) corresponding to the target voltage VIN. A second terminal of the resistor R22 receives the reference voltage VSS. The comparison terminal IN1 of the voltage comparator 400 may be coupled to the second terminal of the resistor R21 to receive the divided voltage Vd2 as the first corresponding voltage. That is, in the application example shown in FIG. 2, the first corresponding voltage of the comparison terminal IN1 is the divided voltage Vd2 of the target voltage VIN, and the second corresponding voltage of the comparison terminal IN2 is the same as the target voltage VIN.

Figure 3:
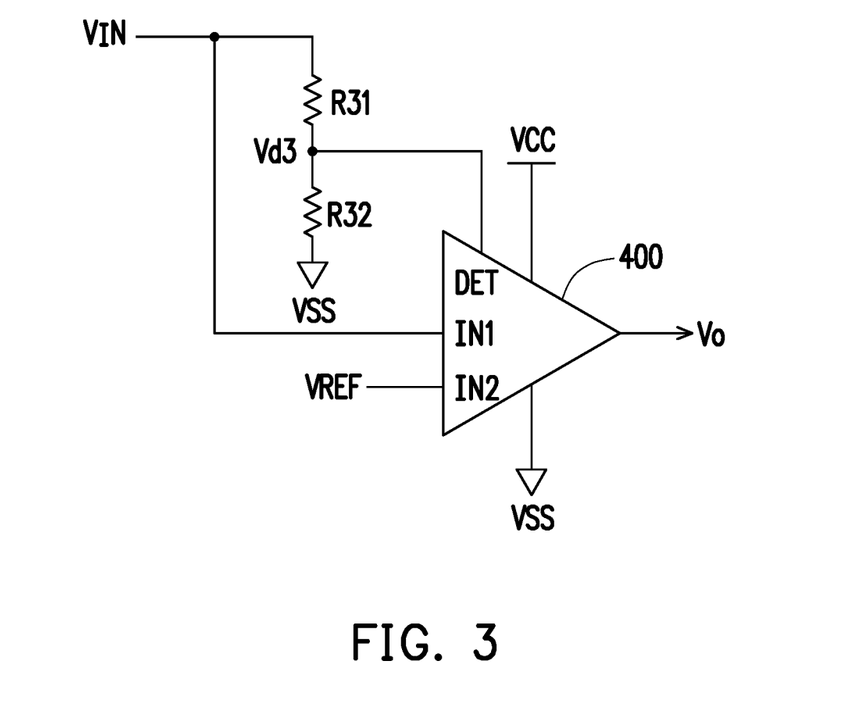
FIG. 3 is a schematic diagram of an application circuit of the voltage comparator according to yet another embodiment of the disclosure.

FIG. 3 is a schematic diagram of an application circuit of the voltage comparator 400 according to yet another embodiment of the disclosure. For the voltage comparator 400 shown in FIG. 3, reference may be made to the related description of the voltage comparator 400 shown in FIG. 1, so there will be no reiteration. In the application example shown in FIG. 3, the comparison terminal IN1 of the voltage comparator 400 may receive the target voltage VIN as the first corresponding voltage. A first terminal of a resistor R31 receives the target voltage VIN. A first terminal of a resistor R32 is coupled to a second terminal of the resistor R31 to receive a divided voltage Vd3 (the second corresponding voltage) corresponding to the target voltage VIN. A second terminal of the resistor R32 receives the reference voltage VSS. The detection terminal DET of the voltage comparator 400 may be coupled to the second terminal of the resistor R31 to receive the divided voltage Vd3 as the second corresponding voltage. That is, in the application example shown in FIG. 3, the first corresponding voltage of the comparison terminal IN1 is the same as the target voltage VIN, and the second corresponding voltage of the comparison terminal IN2 is the divided voltage Vd3 of the target voltage VIN.

Figure 4:
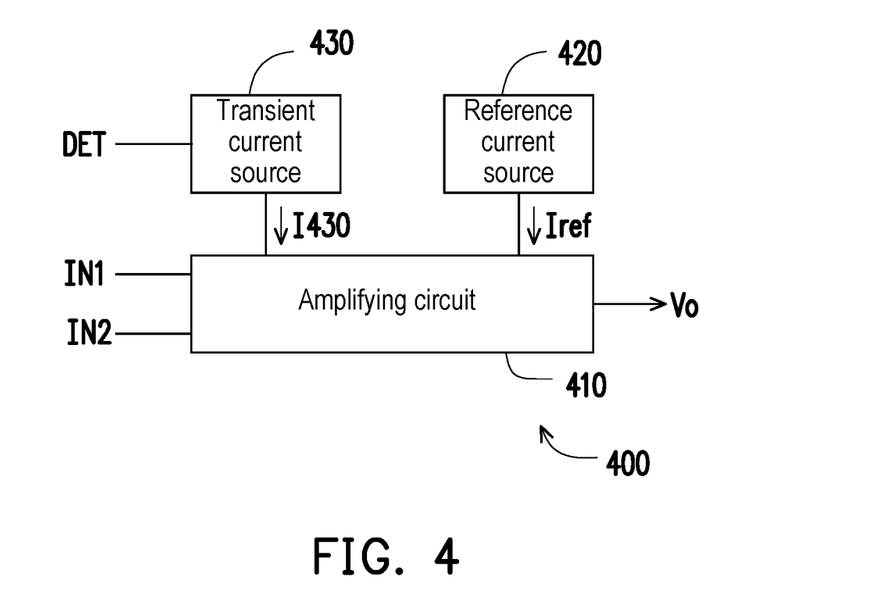
FIG. 4 is a schematic diagram of a circuit block of the voltage comparator according to an embodiment of the disclosure.

FIG. 4 is a schematic diagram of a circuit block of the voltage comparator 400 shown in FIG. 1 to FIG. 3 according to an embodiment of the disclosure. According to actual application, for the voltage comparator 400 shown in FIG. 4, reference may be made to the related description of the voltage comparator 400 shown in FIG. 1, FIG. 2, or FIG. 3. In the embodiment shown in FIG. 4, the voltage comparator 400 includes an amplifying circuit 410, a reference current source 420, and a transient current source 430. A first input terminal and a second input terminal of the amplifying circuit 410 are respectively coupled to the comparison terminal IN1 and the comparison terminal IN2. According to actual design, in some embodiments, the first input terminal of the amplifying circuit 410 may be a non-inverting input terminal, and the second input terminal of the amplifying circuit 410 may be an inverting input terminal. In other embodiments, the first input terminal of the amplifying circuit 410 may be an inverting input terminal, and the second input terminal of the amplifying circuit 410 may be a non-inverting input terminal. An output terminal of the amplifying circuit 410 is coupled to the output terminal of the voltage comparator 400 to output the amplified voltage Vo.

The reference current source 420 is coupled to the amplifying circuit 410 to provide a reference current Iref. The level of the reference current Iref may be determined according to actual design. For example, the level of the reference current Iref may meet the requirements of product power consumption. The reference current source 420 may provide the reference current Iref suitable for the target voltage VIN in a steady state to the amplifying circuit 410. In some embodiments, the reference current Iref may be provided to an input pair of the amplifying circuit 410.

The transient current source 430 is coupled to the amplifying circuit 410 to selectively provide a transient current I430 to the amplifying circuit 410. An input terminal of the transient current source 430 is coupled to the detection terminal DET of the voltage comparator 400 to receive the second corresponding voltage. The transient current source 430 may detect a transition of the second corresponding voltage of the detection terminal DET of the voltage comparator 400 to dynamically adjust the transient current I430. According to actual design, in some embodiments, the transient current source 430 may dynamically adjust the transient current I430 to a positive value or zero. "The transient current I430 having a positive value" means that the transient current I430 flows from the transient current source 430 to the amplifying circuit 410. In other embodiments, the transient current source 430 may dynamically adjust the transient current I430 to a negative value or zero. "The transient current I430 having a negative value" means that the transient current I430 flows from the amplifying circuit 410 to the transient current source 430.

Figure 5:
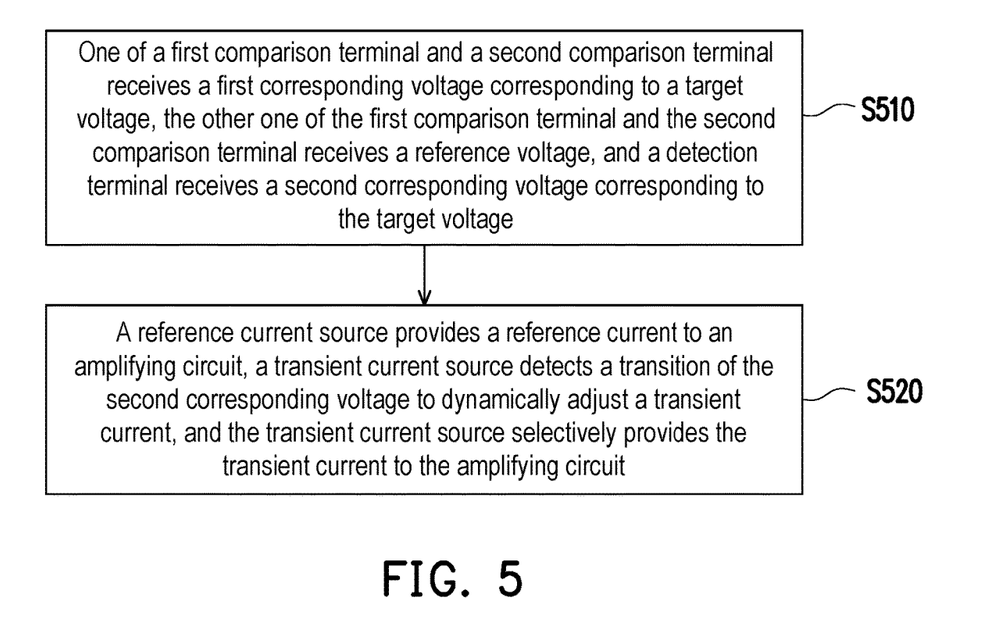
FIG. 5 is a schematic diagram of a process of an operation method of a voltage comparator according to an embodiment of the disclosure.

FIG. 5 is a schematic diagram of a process of an operation method of a voltage comparator according to an embodiment of the disclosure. Please refer to FIG. 4 and FIG. 5. In Step S510, one of the first comparison terminal of the voltage comparator 400 and the second comparison terminal of the voltage comparator 400 (for example, the comparison terminal IN1) receives the first corresponding voltage corresponding to the target voltage VIN, and the other one of the first comparison terminal of the voltage comparator 400 and the second comparison terminal of the voltage comparator 400 (for example, the comparison terminal IN2) receives the reference voltage VREF. The detection terminal DET of the voltage comparator 400 may receive the second corresponding voltage corresponding to the target voltage VIN in Step S510. In the application example shown in FIG. 1, the first corresponding voltage and the second corresponding voltage are the same as the target voltage VIN. In the application example shown in FIG. 2, the first corresponding voltage is the divided voltage of the target voltage VIN, and the second corresponding voltage is the same as the target voltage VIN. In the application example shown in FIG. 3, the first corresponding voltage is the same as the target voltage VIN, and the second corresponding voltage is the divided voltage of the target voltage VIN.

Please refer to FIG. 4 and FIG. 5. The reference current source 420 may provide the reference current Iref to the amplifying circuit 410 in Step S520. In addition, in Step S520, the transient current source 430 may detect the transition of the second corresponding voltage of the detection terminal DET of the voltage comparator 400 to dynamically adjust the transient current I430. The transient current source 430 may selectively provide the transient current I430 to the amplifying circuit 410.

For example, in some embodiments, the transient current source 430 may detect whether a rapidly increasing voltage occurs in the second corresponding voltage. When a rapidly increasing voltage occurs in the second corresponding voltage of the detection terminal DET (that is, a rapidly increasing voltage occurs in the target voltage VIN), the transient current source 430 increases the transient current I430 from a first current value to a second current value during a transient period corresponding to a rising edge of the rapidly increasing voltage. The first current value of the transient current I430 may be suitable for the target voltage VIN in the steady state to meet the requirements of product power consumption. The second current value of the transient current I430 may be suitable for the target voltage VIN in the transition to meet the requirements of response speed. The first current value and the second current value may be determined according to actual design. For example, the first current value may be 0 (or a positive value), and the second current value may be a positive value greater than the first current value. "The transient current I430 having a positive value" means that the transient current I430 flows from the transient current source 430 to the amplifying circuit 410. After the transient period ends, the transient current source 430 may adjust the transient current I430 from the second current value back to the first current value to meet the requirements of product power consumption.

In summary, for the target voltage VIN in the steady state, the reference current source 420 and the transient current source 430 may provide the suitable reference current Iref and transient current I430 to the amplifying circuit 410. During the period when the target voltage VIN is in the steady state, the transient current source 430 may reduce the absolute value of the transient current I430 as much as possible (even set the transient current I430 to 0 amperes) to meet the requirements of product power consumption. When the rapidly increasing voltage occurs in the target voltage VIN, the transient current source 430 may temporarily increase the absolute value of the transient current I430 to accelerate the response speed of the amplifying circuit 410 during the transition period of the target voltage VIN. Therefore, the voltage comparator 400 can attend to requirements such as "small current" and "fast response".

Figure 6:
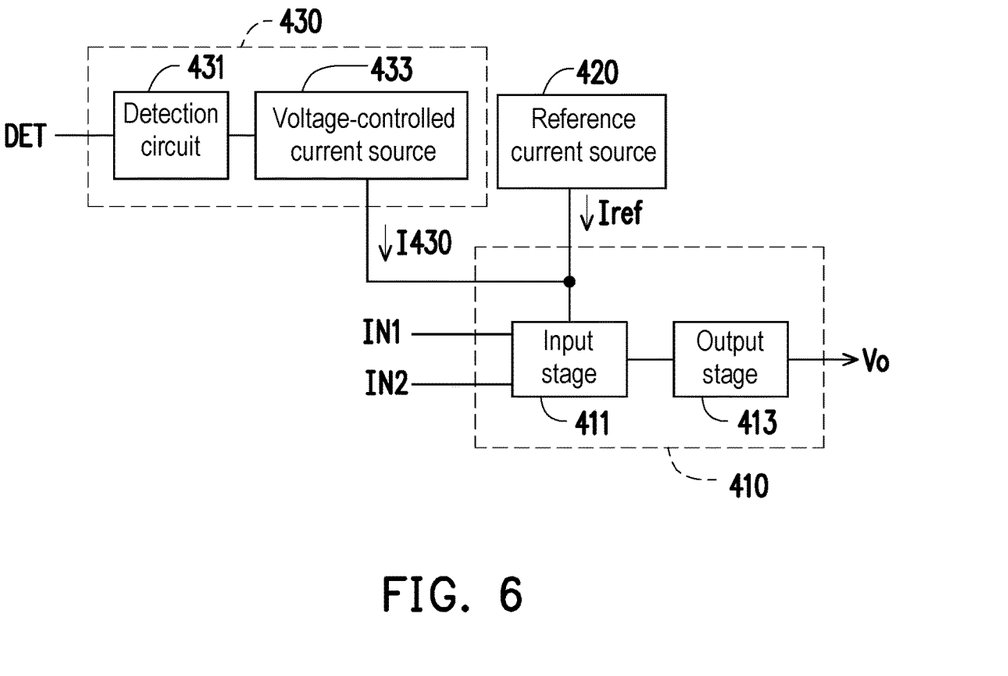
FIG. 6 is a schematic diagram of a circuit block of an amplifying circuit and a transient current source shown in FIG. 4 according to an embodiment of the disclosure.

FIG. 6 is a schematic diagram of a circuit block of the amplifying circuit 410 and the transient current source 430 shown in FIG. 4 according to an embodiment of the disclosure. For the amplifying circuit 410, the reference current source 420, and the transient current source 430 shown in FIG. 6, reference may be made to the related description of the amplifying circuit 410, the reference current source 420, and the transient current source 430 shown in FIG. 4, so there will be no reiteration. The amplifying circuit 410 shown in FIG. 6 includes an input stage 411 and an output stage 413. A first input terminal and a second input terminal of the input stage 411 are respectively coupled to the comparison terminal IN1 and the comparison terminal IN2 of the voltage comparator 400. According to actual design, in some embodiments, the first input terminal of the input stage 411 may be a non-inverting input terminal, and the second input terminal of the input stage 411 may be an inverting input terminal. In other embodiments, the first input terminal of the input stage 411 may be an inverting input terminal, and the second input terminal of the input stage 411 may be a non-inverting input terminal. A reference power terminal of the input stage 411 is coupled to the reference current source 420 to receive the reference current Iref. A current terminal of the transient current source 430 is coupled to the reference power terminal of the input stage 411 to selectively provide the transient current I430. An input terminal of the output stage 413 is coupled to an output terminal of the input stage 411. An output terminal of the output stage 413 is coupled to the output terminal of the voltage comparator 400 to output the amplified voltage Vo.

In the embodiment shown in FIG. 6, the transient current source 430 includes a detection circuit 431 and a voltage-controlled current source 433. An input terminal of the detection circuit 431 is coupled to the detection terminal DET of the voltage comparator 400 to receive the second corresponding voltage. The detection circuit 431 may detect the transition of the second corresponding voltage of the detection terminal DET of the voltage comparator 400 to output a detection result. The voltage-controlled current source 433 is coupled to the detection circuit 431 to receive the detection result. The voltage-controlled current source 433 is controlled by the detection result to dynamically adjust the transient current I430.

For example, in some embodiments, the detection circuit 431 may detect whether a rapidly increasing voltage occurs in the second corresponding voltage of the detection terminal DET of the voltage comparator 400. When a rapidly increasing voltage occurs in the second corresponding voltage of the detection terminal DET (that is, a rapidly increasing voltage occurs in the target voltage VIN), the voltage-controlled current source 433 may increase the transient current I430 from the first current value to the second current value (for example, from 0 to a positive value) according to the detection result of the detection circuit 431 during a transient period corresponding to a rising edge of the rapidly increasing voltage to meet the requirements of response speed. After the transient period ends, the voltage-controlled current source 433 may adjust the transient current I430 from the second current value back to the first current value (for example, from the positive value back to 0) according to the detection result of the detection circuit 431 to meet the requirements of product power consumption.

Figure 7:
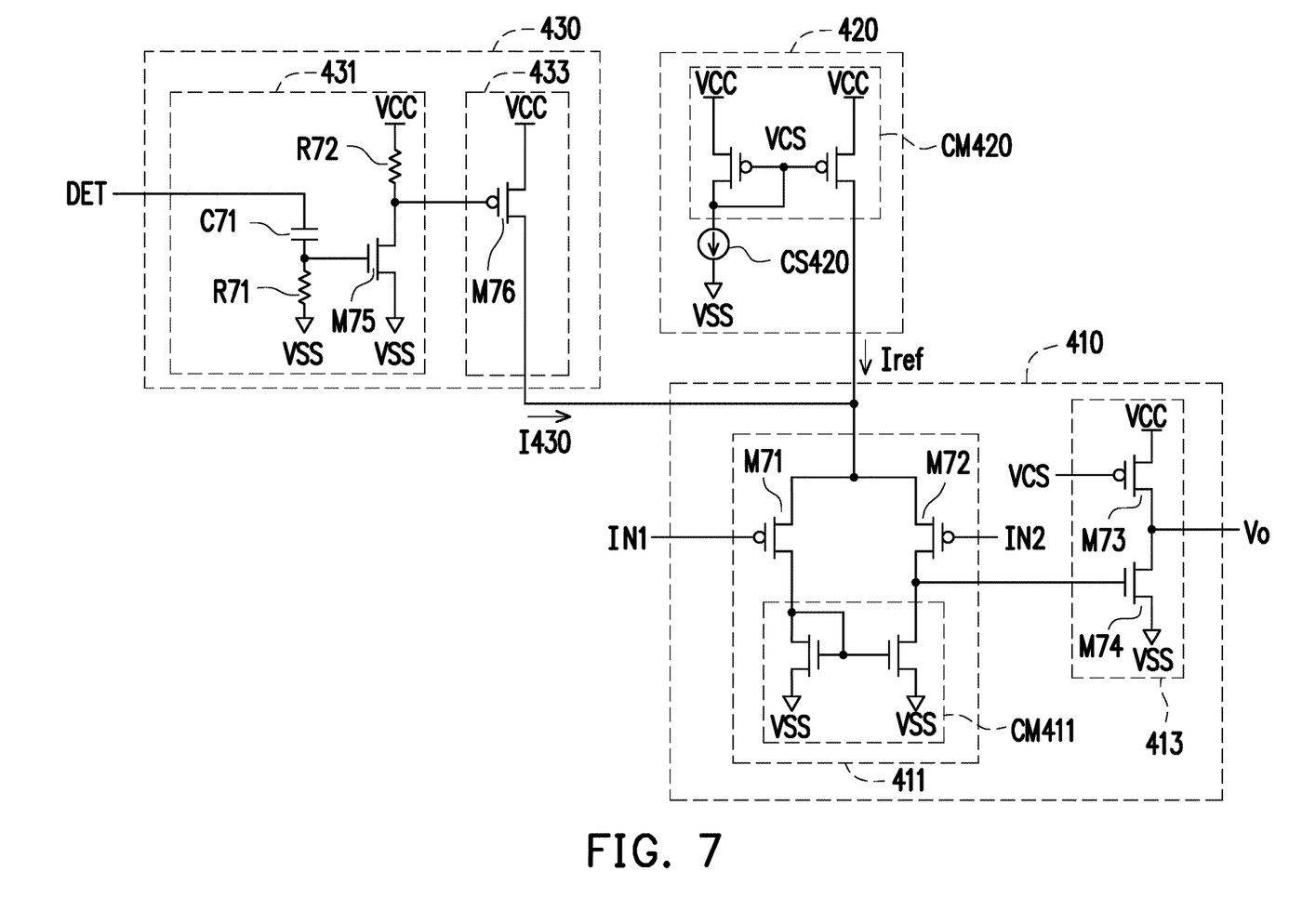
FIG. 7 is a schematic diagram of a circuit block of the amplifying circuit, a reference current source, and the transient current source shown in FIG. 6 according to an embodiment of the disclosure.

FIG. 7 is a schematic diagram of a circuit block of the amplifying circuit 410, the reference current source 420, and the transient current source 430 shown in FIG. 6 according to an embodiment of the disclosure. For the amplifying circuit 410, the reference current source 420, and the transient current source 430 shown in FIG. 7, reference may be made to the related description of the amplifying circuit 410, the reference current source 420, and the transient current source 430 shown in FIG. 6, so there will be no reiteration. In the embodiment shown in FIG. 7, the reference current source 420 includes a current source CS420 and a current mirror CM420. A master current terminal of the current mirror CM420 is coupled to the current source CS420. A slave current terminal of the current mirror CM420 is coupled to the amplifying circuit 410 to provide the reference current Iref.

In the embodiment shown in FIG. 7, the input stage 411 of the amplifying circuit 410 includes an input pair (transistors M71 and M72 shown in FIG. 7) and a current mirror CM411. First terminals (for example, sources) of the transistors M71 and M72 are coupled to the reference current source 420 and the transient current source 430 to receive the reference current Iref and the transient current I430. A control terminal (for example, a gate) of the transistor M71 is coupled to the comparison terminal IN1 of the voltage comparator 400. A second terminal (for example, a drain) of the transistor M71 is coupled to a master current terminal of the current mirror CM411. A control terminal (for example, a gate) of the transistor M72 is coupled to the comparison terminal IN2 of the voltage comparator 400. A second terminal (for example, a drain) of the transistor M72 is coupled to a slave current terminal of the current mirror CM411. A second terminal of the transistor M72 is also coupled to the input terminal of the output stage 413.

In the embodiment shown in FIG. 7, the output stage 413 of the amplifying circuit 410 includes a transistor M73 and a transistor M74. A first terminal (for example, a source) of the transistor M73 is coupled to the system voltage VCC. A control terminal (for example, a gate) of the transistor M73 is coupled to the current mirror CM420 of the reference current source 420 to receive a bias voltage VCS. A second terminal (for example, a drain) of the transistor M73 is coupled to the output terminal of the voltage comparator 400 to output the amplified voltage Vo. A first terminal (for example, a drain) of the transistor M74 is coupled to the second terminal of the transistor M73. A control terminal (for example, a gate) of the transistor M74 is coupled to the second terminal of the transistor M72 of the input stage 411. A second terminal (for example, a source) of the transistor M74 is coupled to the reference voltage VSS.

In the embodiment shown in FIG. 7, the detection circuit 431 of the transient current source 430 includes a capacitor C71, a resistor R71, a resistor R72, and a transistor M75. A first terminal of the capacitor C71 is coupled to the detection terminal DET of the voltage comparator 400 to receive the second corresponding voltage. A first terminal of the resistor R71 is coupled to a second terminal of the capacitor C71. A second terminal of the resistor R71 receives a first power voltage (for example, the reference voltage VSS). A control terminal (for example, a gate) of the transistor M75 is coupled to the second terminal of the capacitor C71. A first terminal (for example, a source) of the transistor M75 receives the first power voltage (for example, the reference voltage VSS). A first terminal of the resistor R72 is coupled to a second terminal (for example, a drain) of the transistor M75. A second terminal of the resistor R72 receives a second power voltage (for example, the system voltage VCC). A second terminal of the transistor M75 and the first terminal of the resistor R72 jointly provide the detection result to the voltage-controlled current source 433.

In the embodiment shown in FIG. 7, the voltage-controlled current source 433 of the transient current source 430 includes a transistor M76. A control terminal (for example, a gate) of the transistor M76 is coupled to the detection circuit 431 to receive the detection result. A first terminal (for example, a source) of the transistor M76 receives a power voltage (for example, the system voltage VCC). A second terminal (for example, a drain) of the transistor M76 is coupled to the amplifying circuit 410 to selectively provide the transient current I430 to the input pair (the transistors M71 and M72 shown in FIG. 7) of the input stage 411.

The detection circuit 431 may detect whether a rapidly increasing voltage occurs in the second corresponding voltage of the detection terminal DET of the voltage comparator 400. When a rapidly increasing voltage occurs in the second corresponding voltage of the detection terminal DET (that is, a rapidly increasing voltage occurs in the target voltage VIN), the rapidly increasing voltage may pull up the voltage of the control terminal of the transistor M75, thereby turning on the transistor M75. The turned-on transistor M75 may pull down the voltage of the control terminal of the transistor M76, thereby turning on the transistor M76. The turned-on transistor M76 may increase the transient current I430 from the first current value to the second current value (for example, from 0 to a positive value) during a transient period corresponding to a rising edge of the rapidly increasing voltage to meet the requirements of response speed. After the transient period ends, the transistor M75 and the transistor M76 may be immediately turned off to adjust the transient current I430 from the second current value back to the first current value (for example, from the positive value back to 0) to meet the requirements of product power consumption.

In summary, for the target voltage VIN in the steady state, the reference current source 420 may provide the suitable reference current Iref to the input pair (the transistors M71 and M72 shown in FIG. 7) of the input stage 411 to meet the requirements of product power consumption. During the period when the target voltage VIN is in the steady state, the transistor M76 may reduce the absolute value of the transient current I430 as much as possible (even set the transient current I430 to 0 amperes) to meet the requirements of product power consumption. When a rapidly increasing voltage occurs in the second corresponding voltage of the detection terminal DET (that is, a rapidly increasing voltage occurs in the target voltage VIN), the transistor M76 may temporarily increase the absolute value of the transient current I430 to increase the current of the input pair of the input stage 411, thereby accelerating the response speed of the amplifying circuit 410 during the transition period of the target voltage VIN. Therefore, the voltage comparator 400 can attend to requirements such as "small current" and "fast response".

Figure 8:
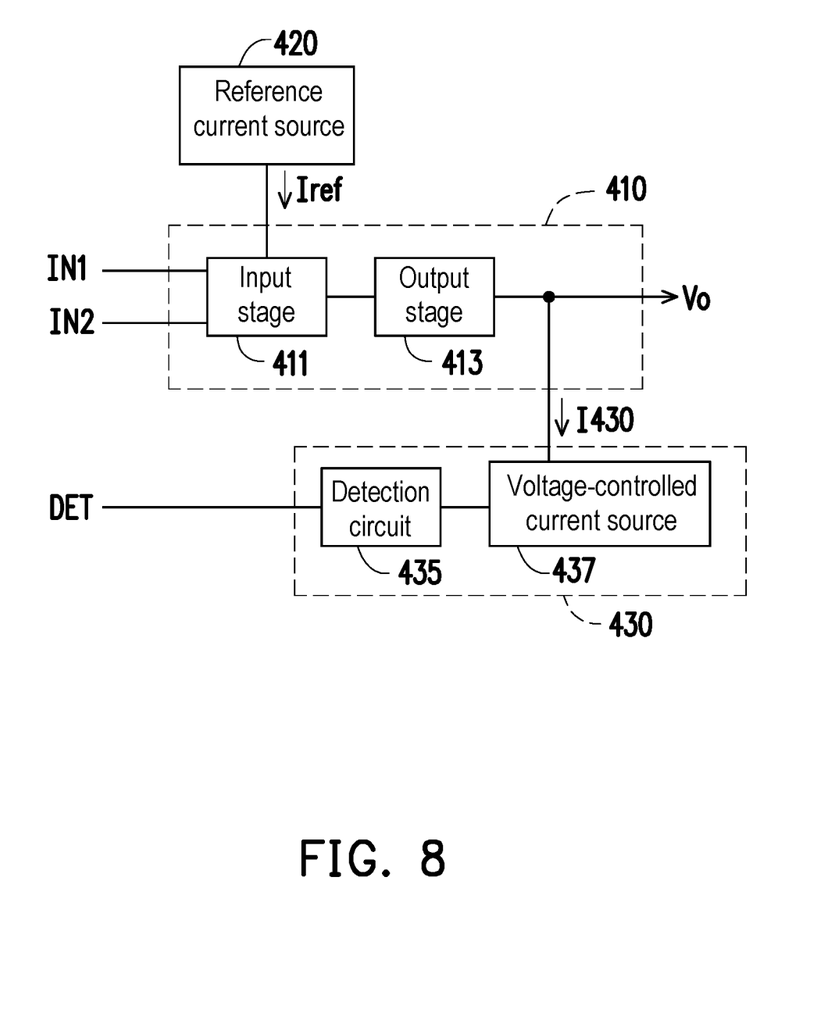
FIG. 8 is a schematic diagram of a circuit block of the amplifying circuit and the transient current source shown in FIG. 4 according to another embodiment of the disclosure.

FIG. 8 is a schematic diagram of a circuit block of the amplifying circuit 410 and the transient current source 430 shown in FIG. 4 according to another embodiment of the disclosure. For the amplifying circuit 410 and the reference current source 420 shown in FIG. 8, reference may be made to the related description of the amplifying circuit 410 and the reference current source 420 shown in FIG. 4, so there will be no reiteration. The amplifying circuit 410 shown in FIG. 8 includes the input stage 411 and the output stage 413. For the input stage 411 and the output stage 413 shown in FIG. 8, reference may be made to the related description of the input stage 411 and the output stage 413 shown in FIG. 6, so there will be no reiteration. In the embodiment shown in FIG. 8, the current terminal of the transient current source 430 is coupled to the output terminal of the output stage 413 to selectively draw the transient current I430.

In the embodiment shown in FIG. 8, the transient current source 430 includes a detection circuit 435 and a voltage-controlled current source 437. For the detection circuit 435 and the voltage-controlled current source 437 shown in FIG. 8, reference may be made to the related description of the detection circuit 431 and the voltage-controlled current source 433 shown in FIG. 6, so there will be no reiteration. The detection circuit 435 may detect the transition of the second corresponding voltage of the detection terminal DET of the voltage comparator 400 to output the detection result. The voltage-controlled current source 437 is controlled by the detection result to dynamically adjust the transient current I430.

For example, in some embodiments, the detection circuit 435 may detect whether a rapidly decreasing voltage occurs in the second corresponding voltage of the detection terminal DET of the voltage comparator 400. When a rapidly decreasing voltage occurs in the second corresponding voltage of the detection terminal DET (that is, a rapidly decreasing voltage occurs in the target voltage VIN), the voltage-controlled current source 437 may draw the transient current I430 at the output terminal of the output stage 413 according to a detection result of the detection circuit 435 during a transient period corresponding to a falling edge of the rapidly decreasing voltage to quickly pull down the amplified voltage Vo to meet the requirements of response speed. After the transient period ends, the voltage-controlled current source 437 no longer draws the transient current I430 to meet the requirements of product power consumption.

Figure 9:
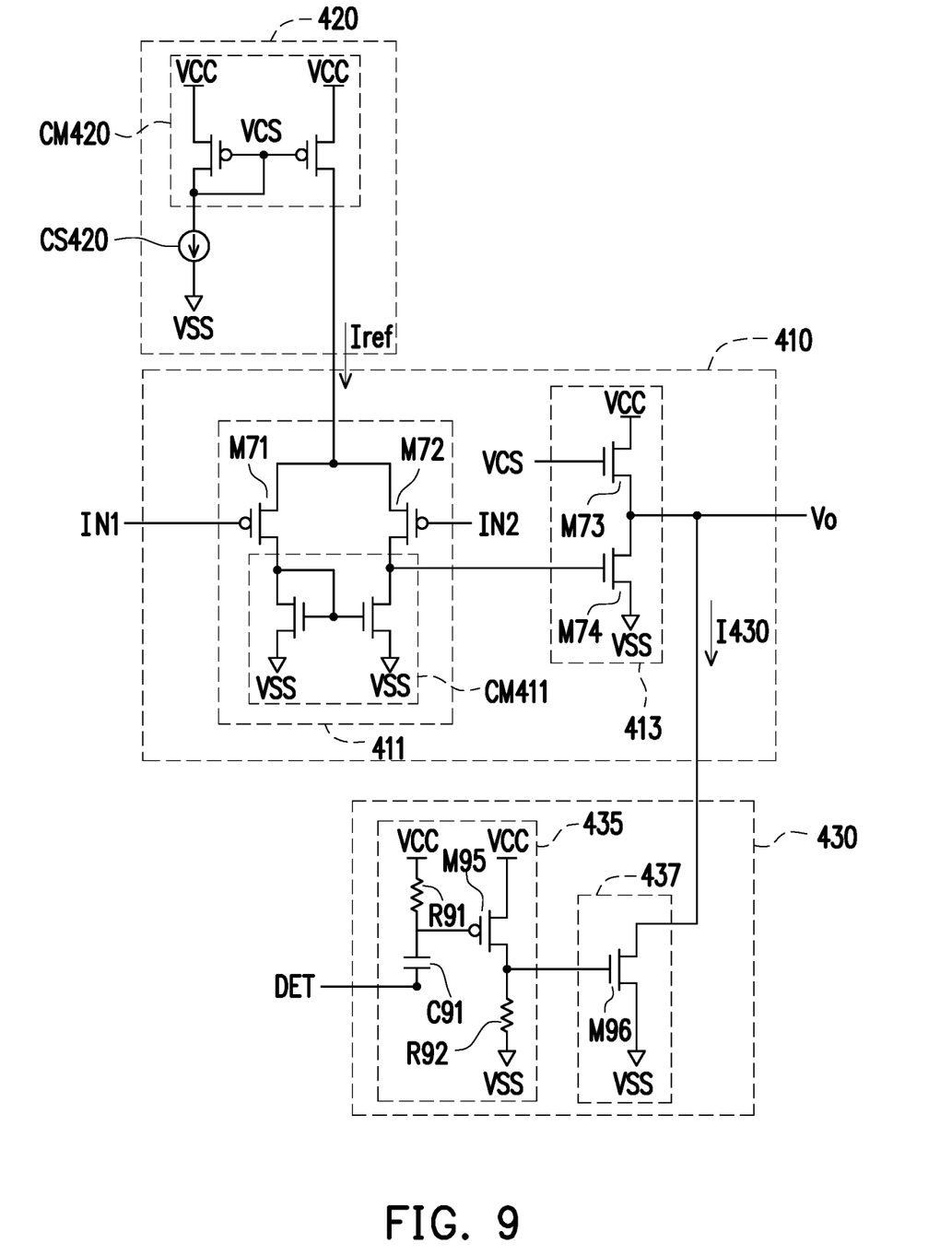
FIG. 9 is a schematic diagram of a circuit block of the amplifying circuit, the reference current source, and the transient current source shown in FIG. 8 according to an embodiment of the disclosure.

FIG. 9 is a schematic diagram of a circuit block of the amplifying circuit 410, the reference current source 420, and the transient current source 430 shown in FIG. 8 according to an embodiment of the disclosure. For the amplifying circuit 410, the reference current source 420, and the transient current source 430 shown in FIG. 9, reference may be made to the related description of the amplifying circuit 410, the reference current source 420, and the transient current source 430 shown in FIG. 8, so there will be no reiteration. In the embodiment shown in FIG. 9, the detection circuit 435 of the transient current source 430 includes a capacitor C91, a resistor R91, a resistor R92, and a transistor M95. A first terminal of the capacitor C91 is coupled to the detection terminal DET of the voltage comparator 400 to receive the second corresponding voltage. A first terminal of the resistor R91 is coupled to a second terminal of the capacitor C91. A second terminal of the resistor R91 receives the first power voltage (for example, the system voltage VCC). A control terminal (for example, a gate) of the transistor M95 is coupled to the second terminal of the capacitor C91. A first terminal (for example, a source) of the transistor M95 receives the first power voltage (for example, the system voltage VCC). A first terminal of the resistor R92 is coupled to a second terminal (for example, a drain) of the transistor M95. A second terminal of the resistor R92 receives the second power voltage (for example, the reference voltage VSS). A second terminal of the transistor M95 and the first terminal of the resistor R92 jointly provide the detection result to the voltage-controlled current source 437.

In the embodiment shown in FIG. 9, the voltage-controlled current source 437 of the transient current source 430 includes a transistor M96. A control terminal (for example, a gate) of the transistor M96 is coupled to the detection circuit 435 to receive the detection result. A first terminal (for example, a source) of the transistor M96 receives the power voltage (for example, the reference voltage VSS). A second terminal (for example, a drain) of the transistor M96 is coupled to the amplifying circuit 410 to selectively draw the transient current I430 from the output terminal of the output stage 413.

The detection circuit 435 may detect whether a rapidly decreasing voltage occurs in the second corresponding voltage of the detection terminal DET of the voltage comparator 400. When a rapidly decreasing voltage occurs in the second corresponding voltage of the detection terminal DET (that is, a rapidly decreasing voltage occurs in the target voltage VIN), the rapidly decreasing voltage may pull down the voltage of the control terminal of the transistor M95, thereby turning on the transistor M95. The turned-on transistor M95 may pull down the voltage of the control terminal of the transistor M96, thereby turning on the transistor M96. The turned-on transistor M96 may draw the transient current I430 at the output terminal of the output stage 413 during a transient period corresponding to a falling edge of the rapidly decreasing voltage to immediately pull down the amplified voltage Vo to approximately the level of the reference voltage VSS to meet the requirements of response speed. After the transient period ends, the transistor M95 and the transistor M96 may be immediately turned off, and the voltage-controlled current source 437 no longer draws the transient current I430 to meet the requirements of product power consumption.

In summary, for the target voltage VIN in the steady state, the reference current source 420 may provide the suitable reference current Iref to the input pair (the transistors M71 and M72 shown in FIG. 9) of the input stage 411 to meet the requirements of product power consumption. During the period when the target voltage VIN is in the steady state, the transistor M96 may reduce the absolute value of the transient current I430 as much as possible (even set the transient current I430 to 0 amperes, that is, the level without interference to the amplified voltage Vo). When a rapidly decreasing voltage occurs in the second corresponding voltage of the detection terminal DET (that is, a rapidly decreasing voltage occurs in the target voltage VIN), the transistor M96 may temporarily increase the absolute value of the transient current I430 to immediately pull down the amplified voltage Vo to approximately the level of the reference voltage VSS, thereby accelerating the response speed of the amplifying circuit 410 during the transition period of the target voltage VIN. Therefore, the voltage comparator 400 can attend to requirements such as "small current" and "fast response".

Figure 10:
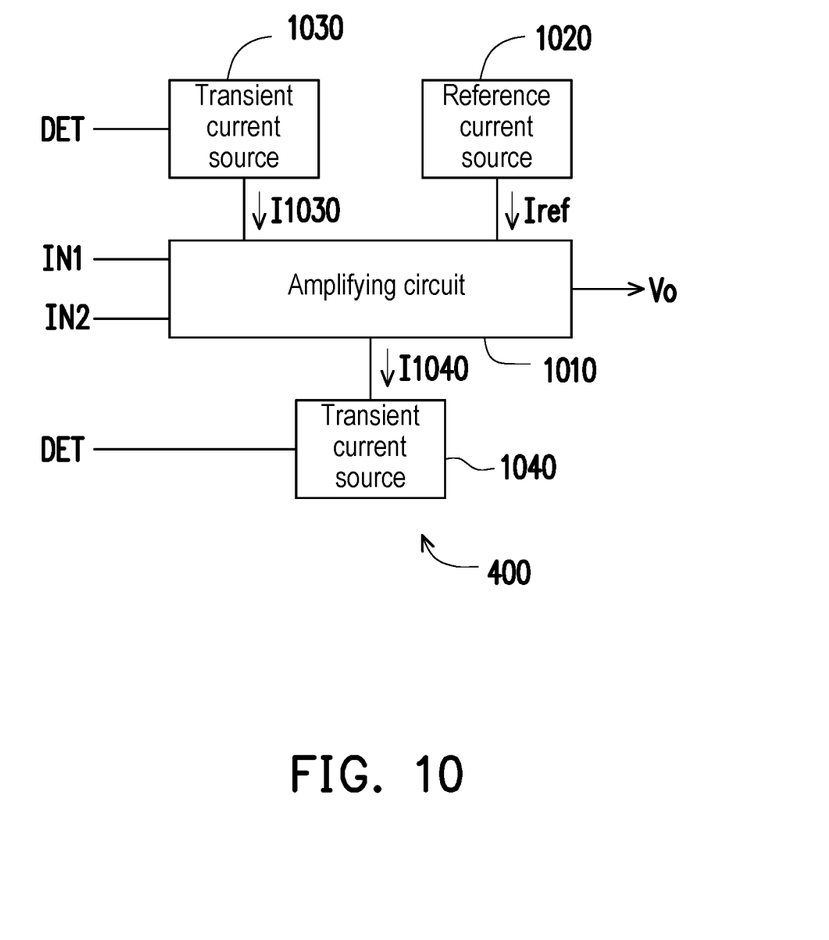
FIG. 10 is a schematic diagram of a circuit block of the voltage comparator shown in FIG. 1 to FIG. 3 according to another embodiment of the disclosure.

FIG. 10 is a schematic diagram of a circuit block of the voltage comparator 400 shown in FIG. 1 to FIG. 3 according to another embodiment of the disclosure. According to actual application, for the voltage comparator 400 shown in FIG. 10, reference may be made to the related description of the voltage comparator 400 shown in FIG. 1, FIG. 2, or FIG. 3. In the embodiment shown in FIG. 10, the voltage comparator 400 includes an amplifying circuit 1010, a reference current source 1020, a transient current source 1030, and a transient current source 1040. For the amplifying circuit 1010 and the reference current source 1020 shown in FIG. 10, reference may be made to the related description of the amplifying circuit 410 and the reference current source 420 shown in FIG. 4 and FIG. 6 to FIG. 9, so there will be no reiteration. For the transient current source 1030 and the transient current source 1040 shown in FIG. 10, reference may be made to the related description of the transient current source 430 shown in FIG. 4 and FIG. 6 to FIG. 9.

The transient current source 1030 is coupled to the amplifying circuit 1010 to selectively provide the transient current I1030 to the amplifying circuit 1010. An input terminal of the transient current source 1030 is coupled to the detection terminal DET of the voltage comparator 400 to receive the second corresponding voltage. The transient current source 1030 may detect the transition (for example, detect a rapidly increasing voltage) of the second corresponding voltage of the detection terminal DET of the voltage comparator 400 to dynamically adjust the transient current I1030. According to actual design, in some embodiments, the transient current source 1030 may dynamically adjust the transient current I1030 to a positive value or 0. "The transient current I1030 having a positive value" means that the transient current I1030 flows from the transient current source 1030 to the amplifying circuit 410.

When a rapidly increasing voltage occurs in the second corresponding voltage of the detection terminal DET (that is, a rapidly increasing voltage occurs in the target voltage VIN), the transient current source 1030 may increase the transient current I1030 from the first current value to the second current value during a transient period (a first transient period) corresponding to a rising edge of the rapidly increasing voltage. The first current value of the transient current I1030 may be suitable for the target voltage VIN in the steady state to meet the requirements of product power consumption. The second current value of the transient current I1030 may be suitable for the target voltage VIN in the transition to meet the requirements of response speed. The first current value and the second current value may be determined according to actual design. For example, the first current value may be 0 (or a positive value), and the second current value may be a positive value greater than the first current value. After the first transient period ends, the transient current source 1030 may adjust the transient current I1030 from the second current value back to the first current value to meet the requirements of product power consumption.

The transient current source 1040 is coupled to the amplifying circuit 1010 to selectively draw a transient current I1040 from the amplifying circuit 1010. An input terminal of the transient current source 1040 is coupled to the detection terminal DET of the voltage comparator 400 to receive the second corresponding voltage. The transient current source 1040 may detect the transition (for example, detect a rapidly decreasing voltage) of the second corresponding voltage of the detection terminal DET of the voltage comparator 400 to dynamically adjust the transient current I1040.

When a rapidly decreasing voltage occurs in the second corresponding voltage of the detection terminal DET (that is, a rapidly decreasing voltage occurs in the target voltage VIN), the transient current source 1040 may draw the transient current I1040 at an output terminal of the amplifying circuit 1010 during a transient period (a second transient period) corresponding to a falling edge of the rapidly decreasing voltage to quickly pull down the amplified voltage Vo to meet the requirements of response speed. After the transient period ends, the voltage-controlled current source 437 no longer draws the transient current I1040 to meet the requirements of product power consumption.

Figure 11:
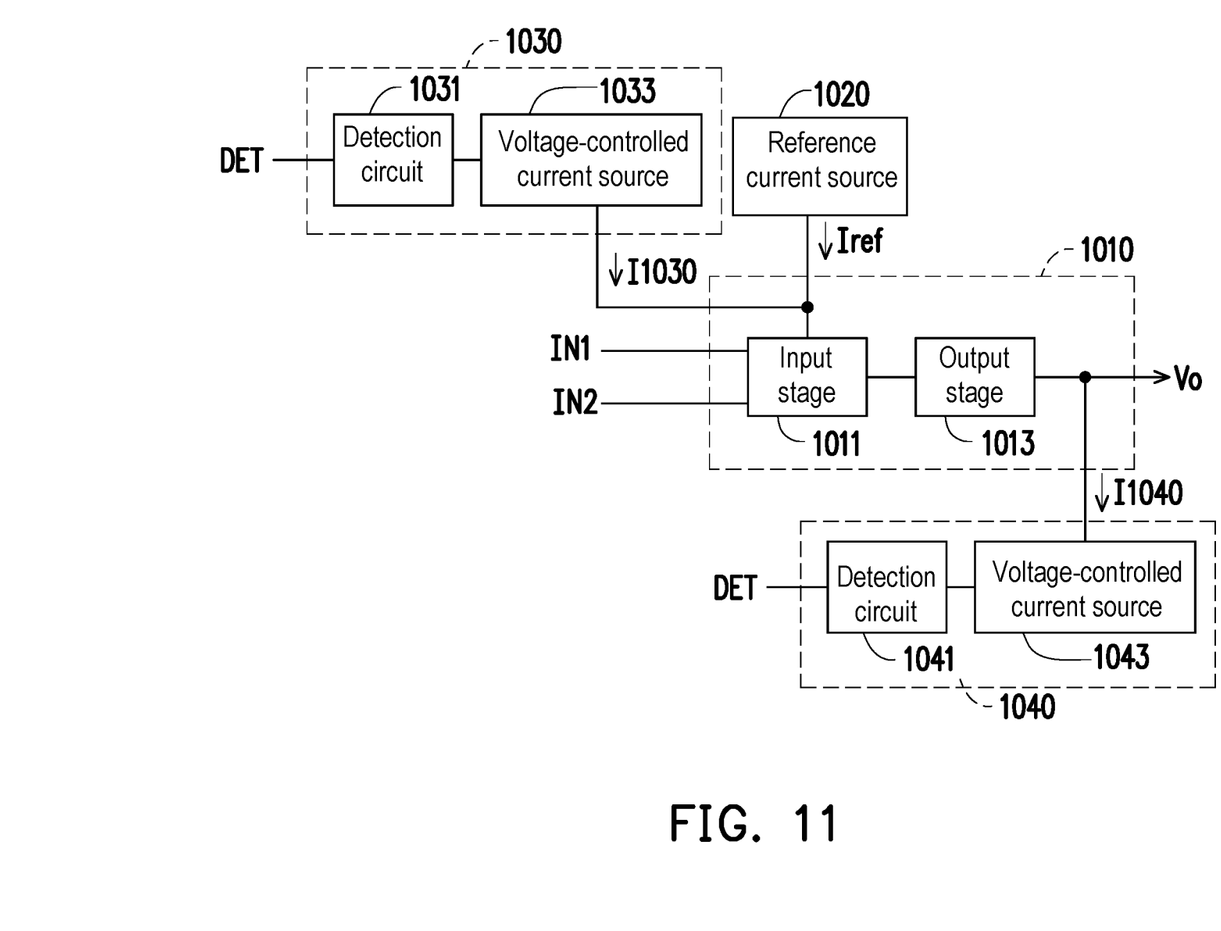
FIG. 11 is a schematic diagram of a circuit block of the amplifying circuit, the transient current source, and the transient current source shown in FIG. 10 according to an embodiment of the disclosure.

FIG. 11 is a schematic diagram of a circuit block of the amplifying circuit 1010, the transient current source 1030, and the transient current source 1040 shown in FIG. 10 according to an embodiment of the disclosure. For the amplifying circuit 1010, the reference current source 1020, the transient current source 1030, and the transient current source 1040 shown in FIG. 11, reference may be made to the related description of the amplifying circuit 1010, the reference current source 1020, the transient current source 1030, and the transient current source 1040 shown in FIG. 10, so there will be no reiteration. The amplifying circuit 1010 shown in FIG. 11 includes an input stage 1011 and an output stage 1013. For the input stage 1011 and the output stage 1013 shown in FIG. 11, reference may be made to the related description of the input stage 411 and the output stage 413 shown in FIG. 6 to FIG. 9, so there will be no reiteration.

In the embodiment shown in FIG. 11, the transient current source 1030 includes a detection circuit 1031 and a voltage-controlled current source 1033. For the detection circuit 1031 and the voltage-controlled current source 1033 shown in FIG. 11, reference may be made to the related description of the detection circuit 431 and the voltage-controlled current source 433 shown in FIG. 6 and FIG. 7, so there will be no reiteration. For example, in some embodiments, the detection circuit 1031 may detect whether a rapidly increasing voltage occurs in the second corresponding voltage of the detection terminal DET of the voltage comparator 400. When a rapidly increasing voltage occurs in the second corresponding voltage of the detection terminal DET (that is, a rapidly increasing voltage occurs in the target voltage VIN), the voltage-controlled current source 1033 may increase the transient current I1030 from the first current value to the second current value (for example, from 0 to a positive value) according to a detection result of the detection circuit 1031 during a transient period corresponding to a rising edge of the rapidly increasing voltage to meet the requirements of response speed. After the transient period ends, the voltage-controlled current source 1033 may adjust the transient current I1030 from the second current value back to the first current value (for example, from a positive value back to 0) according to the detection result of the detection circuit 1031 to meet the requirements of product power consumption.

In the embodiment shown in FIG. 11, the transient current source 1040 includes a detection circuit 1041 and a voltage-controlled current source 1043. For the detection circuit 1041 and the voltage-controlled current source 1043 shown in FIG. 11, reference may be made to the related description of the detection circuit 435 and the voltage-controlled current source 437 shown in FIG. 8 and FIG. 9, so there will be no reiteration. For example, in some embodiments, the detection circuit 1041 may detect whether a rapidly decreasing voltage occurs in the second corresponding voltage of the detection terminal DET of the voltage comparator 400. When a rapidly decreasing voltage occurs in the second corresponding voltage of the detection terminal DET (that is, a rapidly decreasing voltage occurs in the target voltage VIN), the voltage-controlled current source 1043 may draw the transient current I1040 at an output terminal of the output stage 1013 according to a detection result of the detection circuit 1041 during a transient period corresponding to a falling edge of the rapidly decreasing voltage to quickly pull down the amplified voltage Vo to meet the requirements of response speed. After the transient period ends, the voltage-controlled current source 1043 no longer draws the transient current I1040 to meet the requirements of product power consumption.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be defined by the appended claims.

What is claimed is:

1. A voltage comparator, comprising:
    a first comparison terminal and a second comparison terminal, wherein one of the first comparison terminal and the second comparison terminal is adapted to receive a first corresponding voltage corresponding to a target voltage, and other one of the first comparison terminal and the second comparison terminal is adapted to receive a first reference voltage;
    a detection terminal, adapted to receive a second corresponding voltage corresponding to the target voltage;
    an amplifying circuit, having a first input terminal and a second input terminal respectively coupled to the first comparison terminal and the second comparison terminal, wherein an output terminal of the amplifying circuit is coupled to an output terminal of the voltage comparator;
    a reference current source, coupled to the amplifying circuit to provide a reference current; and
    a first transient current source, coupled to the amplifying circuit to selectively provide a first transient current, wherein an input terminal of the first transient current source is coupled to the detection terminal of the voltage comparator to receive the second corresponding voltage, and the first transient current source detects a first transition of the second corresponding voltage to dynamically adjust the first transient current.

2. The voltage comparator according to claim 1, wherein the first corresponding voltage and the second corresponding voltage are same as the target voltage.

3. The voltage comparator according to claim 1, wherein the first corresponding voltage is a divided voltage of the target voltage, and the second corresponding voltage is same as the target voltage.

4. The voltage comparator according to claim 1, wherein the first corresponding voltage is same as the target voltage, and the second corresponding voltage is a divided voltage of the target voltage.

5. The voltage comparator according to claim 1, wherein:
    when a rapidly increasing voltage occurs in the second corresponding voltage, the first transient current source increases the first transient current from a first current value to a second current value during a transient period corresponding to a rising edge of the rapidly increasing voltage, wherein the second current value is a positive value; and
    after the transient period ends, the first transient current source adjusts the first transient current from the second current value back to the first current value.

6. The voltage comparator according to claim 1, further comprising:
    a second transient current source, coupled to the amplifying circuit to selectively draw a second transient current, wherein an input terminal of the second transient current source is coupled to the detection terminal of the voltage comparator to receive the second corresponding voltage, and the second transient current source detects a second transition of the second corresponding voltage to dynamically adjust the second transient current.

7. The voltage comparator according to claim 6, wherein:
    when a rapidly decreasing voltage occurs in the second corresponding voltage, the second transient current source draws the second transient current from the output terminal of the amplifying circuit during a second transient period corresponding to a falling edge of the rapidly decreasing voltage; and
    after the transient period ends, the second transient current source does not draw the second transient current.

8. The voltage comparator according to claim 6, wherein the amplifying circuit comprises:
    an input stage, having a first input terminal and a second input terminal respectively coupled to the first comparison terminal and the second comparison terminal, wherein a reference power terminal of the input stage is coupled to the reference current source to receive the reference current; and
    an output stage, having an input terminal coupled to an output terminal of the input stage, wherein an output terminal of the output stage is coupled to the output terminal of the voltage comparator, wherein
    a current terminal of the second transient current source is coupled to the output terminal of the output stage to selectively draw the second transient current.

9. The voltage comparator according to claim 6, wherein the second transient current source comprises:
    a detection circuit, having an input terminal coupled to the detection terminal of the voltage comparator to receive the second corresponding voltage, wherein the detection circuit detects the second transition of the second corresponding voltage to output a detection result; and a voltage-controlled current source, coupled to the detection circuit to receive the detection result, wherein the voltage-controlled current source is controlled by the detection result to dynamically adjust the second transient current.

10. The voltage comparator according to claim 9, wherein the detection circuit comprises:
    a capacitor, having a first terminal coupled to the detection terminal of the voltage comparator to receive the second corresponding voltage;
    a first resistor, having a first terminal coupled to a second terminal of the capacitor, wherein a second terminal of the first resistor receives a first power voltage;
    a transistor, having a control terminal coupled to the second terminal of the capacitor, wherein a first terminal of the transistor receives the first power voltage; and
    a second resistor, having a first terminal coupled to a second terminal of the transistor, wherein a second terminal of the second resistor receives a second power voltage, and the second terminal of the transistor and the first terminal of the second resistor jointly provide the detection result to the voltage-controlled current source.

11. The voltage comparator according to claim 10, wherein the first power voltage is a system voltage, and the second power voltage is a second reference voltage.

12. The voltage comparator according to claim 9, wherein the voltage-controlled current source comprises:
    a transistor, having a control terminal coupled to the detection circuit to receive the detection result, wherein a first terminal of the transistor receives a first power voltage, and a second terminal of the transistor is coupled to the amplifying circuit to selectively draw the second transient current.

13. The voltage comparator according to claim 1, wherein the amplifying circuit comprises:
    an input stage, having a first input terminal and a second input terminal respectively coupled to the first comparison terminal and the second comparison terminal, wherein a reference power terminal of the input stage is coupled to the reference current source to receive the reference current; and
    an output stage, having an input terminal coupled to an output terminal of the input stage, wherein an output terminal of the output stage is coupled to the output terminal of the voltage comparator, wherein
    a current terminal of the first transient current source is coupled to the reference power terminal of the input stage to selectively provide the first transient current.

14. The voltage comparator according to claim 1, wherein the reference current source comprises:
    a current source; and
    a current mirror, having a master current terminal coupled to the current source, wherein a slave current terminal of the current mirror is coupled to the amplifying circuit to provide the reference current.

15. The voltage comparator according to claim 1, wherein the first transient current source comprises:
    a detection circuit, having an input terminal coupled to the detection terminal of the voltage comparator to receive the second corresponding voltage, wherein the detection circuit detects the first transition of the second corresponding voltage to output a detection result; and
    a voltage-controlled current source, coupled to the detection circuit to receive the detection result, wherein the voltage-controlled current source is controlled by the detection result to dynamically adjust the first transient current.

16. The voltage comparator according to claim 15, wherein the detection circuit comprises:
    a capacitor, having a first terminal coupled to the detection terminal of the voltage comparator to receive the second corresponding voltage;
    a first resistor, having a first terminal coupled to a second terminal of the capacitor, wherein a second terminal of the first resistor receives a first power voltage;
    a transistor, having a control terminal coupled to the second terminal of the capacitor, wherein a first terminal of the transistor receives the first power voltage; and
    a second resistor, having a first terminal coupled to a second terminal of the transistor, wherein a second terminal of the second resistor receives a second power voltage, and the second terminal of the transistor and the first terminal of the second resistor jointly provide the detection result to the voltage-controlled current source.

17. The voltage comparator according to claim 16, wherein the first power voltage is a second reference voltage, and the second power voltage is a system voltage.

18. The voltage comparator according to claim 15, wherein the voltage-controlled current source comprises:
    a transistor, having a control terminal coupled to the detection circuit to receive the detection result, wherein a first terminal of the transistor receives a first power voltage, and a second terminal of the transistor is coupled to the amplifying circuit to selectively provide a first transient current.

19. An operation method of a voltage comparator, comprising:
    receiving a first corresponding voltage corresponding to a target voltage by one of a first comparison terminal of the voltage comparator and a second comparison terminal of the voltage comparator;
    receiving a first reference voltage by other one of the first comparison terminal and the second comparison terminal, wherein a first input terminal and a second input terminal of an amplifying circuit of the voltage comparator are respectively coupled to the first comparison terminal and the second comparison terminal, and an output terminal of the amplifying circuit is coupled to an output terminal of the voltage comparator;
    receiving a second corresponding voltage corresponding to the target voltage by a detection terminal of the voltage comparator, wherein an input terminal of a first transient current source of the voltage comparator is coupled to the detection terminal of the voltage comparator to receive the second corresponding voltage;
    providing a reference current to the amplifying circuit by a reference current source;
    detecting a first transition of the second corresponding voltage by the first transient current source to dynamically adjust a first transient current; and
    selectively providing the first transient current to the amplifying circuit by the first transient current source.

20. The operation method according to claim 19, wherein the first corresponding voltage and the second corresponding voltage are same as the target voltage.

21. The operation method according to claim 19, wherein the first corresponding voltage is a divided voltage of the target voltage, and the second corresponding voltage is same as the target voltage.

22. The operation method according to claim 19, wherein the first corresponding voltage is same as the target voltage, and the second corresponding voltage is a divided voltage of the target voltage.

23. The operation method according to claim 19, further comprising:
when a rapidly increasing voltage occurs in the second corresponding voltage, increasing the first transient current from a first current value to a second current value during a transient period corresponding to a rising edge of the rapidly increasing voltage by the first transient current source, wherein the second current value is a positive value; and
after the transient period ends, adjusting the first transient current source from the second current value back to the first current value by the first transient current source.

24. The operation method according to claim 19, further comprising:
detecting a second transition of the second corresponding voltage by a second transient current source of the voltage comparator to dynamically adjust a second transient current; and
selectively drawing the second transient current from the amplifying circuit by the second transient current source.

25. The operation method according to claim 24, further comprising:
when a rapidly decreasing voltage occurs in the second corresponding voltage, drawing the second transient current from the output terminal of the amplifying circuit during a second transient period corresponding to a falling edge of the rapidly decreasing voltage by the second transient current source; and
after the transient period ends, not drawing the second transient current by the second transient current source.

* * * * *